(12) United States Patent
Shim et al.

(10) Patent No.: US 7,094,617 B2
(45) Date of Patent: Aug. 22, 2006

(54) OPTOELECTRONIC DEVICE HAVING DUAL-STRUCTURAL NANO DOT AND METHOD FOR MANUFACTURING THE SAME

(75) Inventors: Kyu Hwan Shim, Daejon-Shi (KR); Young Joo Song, Daejon-Shi (KR); Sang Hoon Kim, Daejon-Shi (KR); Jin Yeong Kang, Daejon-Shi (KR)

(73) Assignee: Electronics and Telecommunications Research Institute, (KR)

( * ) Notice: Subject to any disclaimer, the term of this patent is extended or adjusted under 35 U.S.C. 154(b) by 188 days.

(21) Appl. No.: 10/912,614

(22) Filed: Aug. 4, 2004

(65) Prior Publication Data

US 2005/0006636 A1   Jan. 13, 2005

Related U.S. Application Data

(62) Division of application No. 10/329,269, filed on Dec. 24, 2002, now Pat. No. 6,791,105.

(30) Foreign Application Priority Data

Aug. 31, 2002 (KR) ............................... 2002-52210

(51) Int. Cl.
*H01L 21/00* (2006.01)
(52) U.S. Cl. ....................................................... 438/22
(58) Field of Classification Search ................... 438/22
See application file for complete search history.

(56) References Cited

U.S. PATENT DOCUMENTS 6,572,784 B1 *   6/2003   Coombs et al. ........ 252/301.16
6,573,527 B1 *   6/2003   Sugiyama et al. ............ 257/14

OTHER PUBLICATIONS

Jpn. J. Appl. Phys. vol. 41 (2002) pp. L299-L301, "Room Temperature 1.58um Photoluminescence . . . ", S. Chu, et al.

* cited by examiner

*Primary Examiner*—Long Pham
(74) *Attorney, Agent, or Firm*—Blakely, Sokoloff, Taylor & Zafman

(57) ABSTRACT

An optoelectronic device and a method of manufacturing the same which the optoelectronic effect such as light emission or light reception can be increased by forming a dual-structural nano dot to enhance the confinement density of electrons and holes are provided. The optoelectronic device comprises an electron injection layer, a nano dot, and a hole injection layer. The nano dot has a dual structure composed of an external nano dot and an internal dot. The method of manufacturing the optoelectronic device comprises the steps of forming an electron injection layer on a semiconductor substrate; growing nano dot layer on the electron injection layer by an epi-growth method; heating the nano dot layer so that the nano dot has a dual structure composed of an external nano dot and an internal nano dot; and forming a hole injection layer on the overall structure.

7 Claims, 4 Drawing Sheets

OPTOELECTRONIC DEVICE HAVING DUAL-STRUCTURAL NANO DOT AND METHOD FOR MANUFACTURING THE SAME

The present patent application is a Divisional of application Ser. No. 10/329,269, filed Dec. 24, 2002, now U.S. Pat. No. 6,791,105.

BACKGROUND OF THE INVENTION

1. Field of the Invention

The present invention relates to an optoelectronic device and the method for manufacturing the same and, more particularly, to an optoelectronic device and the method for manufacturing the same, which the optoelectronic effect such as light emission or light reception can be enhanced by forming a dual-structural nano dot to increase the confinement density of electrons and holes.

2. Description of the Prior Art

As application fields of the optoelectronic device, there are a light emitting device, a light receiving device, an optical guide, an optical modulating device, and a spi-LED. Also, as applications using the devices, there are a silicon ULSI, an optical switch, OEIC (Optoelectronic Integrated Circuit) to which optical signals is applied, and an optical computer and a quantum computer circuit to which a solar battery or an optical operation circuit is provided.

Hereinafter, the conventional optoelectronic device using the nano dot will be described with reference to FIG. 1. The general light emitting device has a simple structure which nano dots are formed in silicon or compound semiconductor. In the optoelectronic device in FIG. 1, a hole injection layer 2 is formed on an electron injection layer 1, and the nano dots 6 are formed in hole injection layer 2 near to the interface between the electron injection layer 1 and the hole injection layer 2.

The conventional optoelectronic device has a limitation in that the structures of the energy bands of the nano dot 6 and the electron and hole injection layers 1 and 2 confine carriers. Due to an indirect band gap of the nano dot 6, the efficiency thereof is low. Furthermore, Since the electrons and the holes have not locally confined at the periphery of the nano dots, the carriers are recombined at the interface between the electron injection layer 1 and the hole injection layer 2. It leads the generated light to spread out with undesired wavelength. And, in case where the electron and the hole injection layers are recombined with the indirect transition type, the recombination does not lead to emit the light, so it is transformed into a type of heat energy. Accordingly, the conventional optoelectronic device comes to have a low efficiency, a high leakage current, and low reliability.

To increase the quantum efficiency, the injected minority carriers must be converged to the nano dots when the forward voltage is applied to the PN junction. However, in case where the structure of the energy band of the nano dot is the stagger type, in which the injection and the confinement of the electron and the hole are not accomplished well, the probability of the recombination of the carriers is low. Accordingly, the development of a new device having high quantum efficiency has been required.

SUMMARY OF THE INVENTION

Thus, the object of the present invention is to provide us for an optoelectronic device with a structure having the dual-structural nano dots, a small nano dot is formed in a large nano dot, in order to enhance the confinement density of the electrons and the holes, thereby the effective light-emitting and light-receiving operation can be performed.

The another object of the present invention is to provide a method of manufacturing the optoelectronic device According to an aspect of the present invention, an optoelectric device comprising an electron injection layer, a nano dot and a hole injection layer formed in a semiconductor substrate, wherein the nano dot has a dual structure composed of an external nano dot and an internal nano dot is provided.

Preferably, the external nano dot is composed of an indirect transition type semiconductor, and the internal nano dot is composed of a direct transition type semiconductor. The optoelectronic device further comprises a quantum well layer, which is formed between the electron injection layer and the hole injection layer and in which the nano dot is included. In addition, the quantum well layer has a dual structure composed of deep quantum well layers and shallow quantum well layers, the deep quantum well layers are formed adjacent to and symmetric with said nano dot, and the shallow quantum well layer are formed on the upper and the lower portions of the deep quantum well layers, respectively.

As the occasion demands, at least two nano dot layers in which the nano dot are multiply formed.

Preferably, the diameter of the external nano dot is in range of 10 to 100 nm, and the diameter of said internal nano dot is equal to and smaller than 12 nm.

According to the other aspect of the present invention, a method of manufacturing an optoelectric device, comprising the steps of forming an electron injection layer on a semiconductor substrate; growing nano dot layer on the electron injection layer by an epi-growth method; heating the nano dot layer so that the nano dot has a dual structure composed of an external nano dot and an internal nano dot; and forming a hole injection layer on the overall structure is provided.

Preferably, the method may further comprise the step of forming a quantum well layer, before or after the step of growing said nano dot layer, or may further comprise the step of forming an epi-layer to be used as said external nano dot layer, before or after the step of growing said nano dot layer.

In addition, the external nano dot is formed with an indirect transition type semiconductor, and the internal nano dot is formed with a direct transition type semiconductor.

On the other hand, the electron injection layer and the hole injection layer may be made of a material of Si, GaAs, GaN, InP, or SiC, and said quantum well layer may be made of a material of SiGe, InGaAs, InGaN, or InAsP.

Both the electron injection layer and the hole injection layer may use the direct transition type semiconductor and the indirect transition type semiconductor, and the structure that the hole injection layer is located in the lower portion and the electron injection layer is located in the upper portion may be used. The quantum well layer may use the undoped direct transition type and the indirect transition type semiconductors. The external nano dot may use the direct transition type and indirect transition type semiconductors. However, the active layer, that is, the internal nano dot for performing the light emission and the light reception uses the direct transition type semiconductor. The external nano dot and the quantum well layer spatially restrain the carriers such as the electron and the hole to concentrate the carriers into the direct transition type internal nano dot. Also, the external nano dot having a small resistivity allows the carriers to flow through the nano dots, the current by the injection of the minority carrier which the current flows into the non-radiative recombination path is minimized, when the forward voltage is applied to the PN junction made of the hetero junction.

BRIEF DESCRIPTION OF THE ATTACHED DRAWINGS

DESCRIPTION OF THE PREFERRED EMBODIMENT

Hereinafter, the preferred embodiments of the present invention will be explained with reference to the accompanying drawings. However, these embodiments are provided so that those skilled in the art can understand the present invention and it may be variously changed, and the present invention should not be understood as limited to the specific embodiments thereof.

Figure 1:
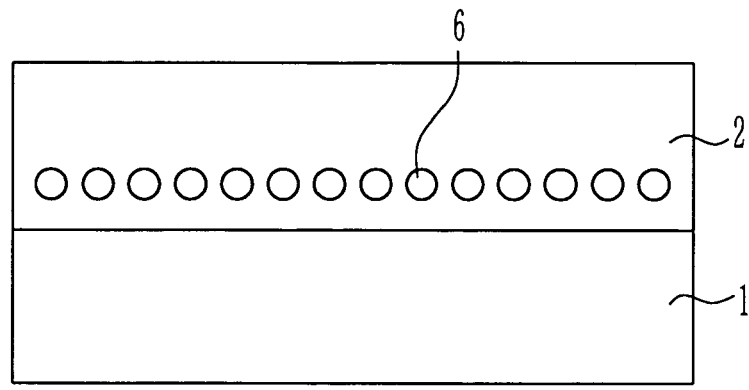
FIG. 1 is a cross sectional view of a conventional hetero junction semiconductor device.
Figure 2:
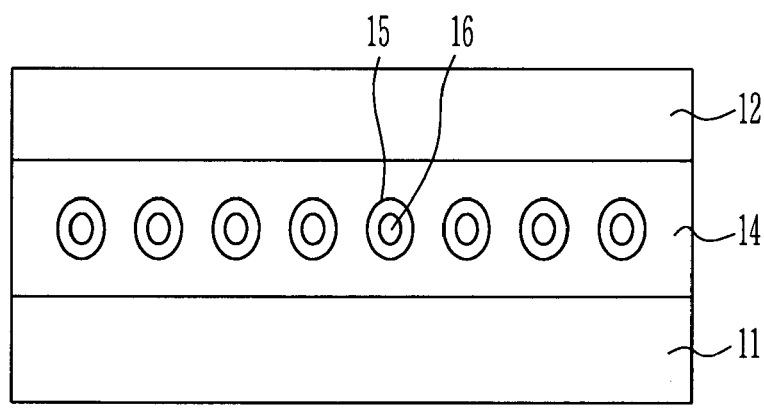
FIG. 2 is a cross sectional view of the optoelectronic device using a dual-structural nano dot according to the present invention.

Referring to FIG. 2, in the optoelectronic device according to the preferred embodiment of the present invention, a quantum well layer 14 is formed on an electron injection layer 11, a hole injection layer 12 is formed on the quantum well layer 14, and an internal nano dots 16 and an external nano dots 15 are formed in the quantum well layer 14. As shown in FIG. 2, since the internal nano dot 16 is formed in the external nano dot 15, the confinement density of the electrons and the holes is increased to enhance the optoelctronic efficiency for light emission and light reception. Accordingly, the optoelectronic device having high efficiency can be accomplished.

The electron injection layer 11 and the hole injection layer 12 may be made of a material of a semiconductor system such as a silicon (Si), a gallium-arsenic (GaAs), a gallium-nitride (GaN), InP, or SiC, and the quantum well layer 14 may be made of a material of a binary system or a ternary system such as SiGe, InGaAs, InGaN, or InAsP, which is the compound semiconductor having a small energy gap. As the electron and hole injection layers 11 and 12, the direct transition type or the indirect transition type of the semiconductor can be used, and the electron injection layer 11 may be formed on the hole injection layer 12.

As for the quantum well layer 14, the direct transition type or the indirect transition type semiconductor may be useful. As for the large nano dot 15, the direct transition type or the indirect transition type semiconductor may be useful, and preferably, the direct transition type semiconductor material is useful for the small nano dot 16 for emitting and receiving the light.

Both the external nano dot 15 and the quantum well layer 14 confine spatially the electrons and the holes. More particularly, by means of the material having large resistivity as the external nano dot 15, the carriers mainly flow through the nano dots, thereby the current of the minority carriers through non-radiative recombination path is minimized, when the forward voltage is applied to the PN junction.

Figure 3:
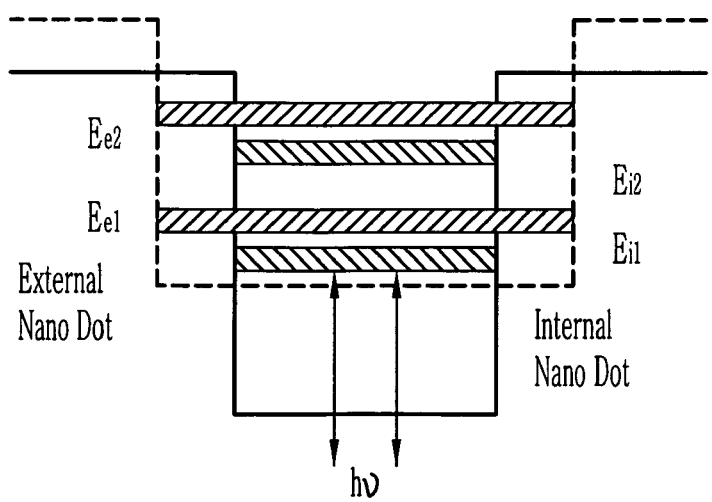
FIG. 3 is a conceptual diagram showing a quantized energy level.

FIG. 3 is a conceptual diagram showing the energy bands of the external nano dot 15 and the internal nano dot 16 shown in FIG. 2. Allowable energy levels Ee1, Ee2 of the external nano dot 15 and allowed energy levels Ei1, Ei2 of the internal nano dot 16 are shown. The recombination and the excitation of the carriers are generated at the energy level Ei1. Such structure may be useful in manufacturing the optoelectronic device by using the indirect transition type semiconductor such as the silicon Si. When the quantum well layer 14 and the external nano dot 15 is formed with the indirect transition type semiconductor such as Si or SiGe, and the internal nano dot 16 is made of the direct transition type semiconductor such as $\beta$-FeSi$_2$, Ru$_2$Si$_3$, GaN, or InP, the device having the carrier restraining effect of the quantum well layer 14 and the external nano dot 15 and the high recombination at the direct transition type nano dot can be manufactured. Since the lifetime of the confined carriers at the external nano dot 15 and the quantum well layer 14 is relatively long and the carriers are spatially confined, it is more efficient than that of the conventional direct transition type semiconductor.

On the other hand, the conducting property and the energy gap of an n-type or p-type carrier can be adjusted by injecting the transition type element such as Mn, Co, or Ni into the silicide nano dot of $\beta$-FeSi$_2$ or Ru$_2$Si$_3$. Similarly, the conducting property can be adjusted by injecting the impurity element such as Si, Mg, Be, or C into the semiconductor such as GaN or InP.

In addition, the preferable shape of the above-mentioned nano dot is spherical shape, and may be manufactured in a semi-spherical shape, or a circular plate shape or an elliptical shape smaller than the semi-spherical shape by adjusting a heat treatment and an epitaxial growth condition. Also, the device having high gain can be manufactured by stacking a plurality of the nano dot layers. That is, if the device has the five nano dot layers formed repeatedly, the gain thereof becomes the ten times as high as device having one nano dot layer. Similarly, several nano dot layers can be stacked in the quantum well layer, and the structure of the device in consideration of the gain, the driving voltage, and the restraining effect of the carrier can be optimized.

In forming the above-mentioned dual-structural nano dot, the diameter of the external nano dot 15 can be adjusted in the wide range of the 10 to 100 nm, and the diameter of the internal nano dot 16 is preferably equal to and lower than 12 nm. For example, when the diameter of the nano dot is in 3 to 12 nm, the distribution of the allowed energy level can be changed up to 100 meV compared to the level of bulk, thereby the optical property having a wide band can be obtained. For example, in case of $\beta$-FeSi$_2$, since the allowable energy level varies from 0.87 eV to 0.97 eV to correspond the wavelength in range of 1.5 m to 1.28 m, it is adapted to application of the optoelectronic device for long distance optical communication of 1.3 m to 1.5 m.

On the other hand, in order to form the internal nano dot 16 surrounded by the external nano dot 15, the epitaxial growth method and high-temperature heating treatment of the self-assembled nano dot can be applicable. The high-temperature heating treatment changes the composition and the thickness of the atom constituting the external nano dot by generating phase segregation between the quantum well and the nano while changed into the spherical type. For example, in case that the internal nano dot is the compound $A_xB_{1-x}$ composed of the atom A and the atom B, and the quantum well is a sort of the mixture of $B_{1-y}C_y$, and the atom C, the Gibb's free energy of the compound $A_xB_{1-x}$ is low at a certain heating temperature. Therefore, it has a tendency to be changed into the spherical type and x value of the thermally-stable compound is to be maintained. In case of the mixture $B_{1-y}C_y$, the Gibb's free energy of the pure material of y=0 or 1is lowest, so the atom C shows the property which is segregated at the interface between $A_xB_{1-x}$ and $B_{1-y}C_y$ when y<<0.5. Accordingly, the appropriate heating treatment makes the structure of the mixture $B_{1-z}C_z$, in which the composition of the atom C is high, exist at the interface between the nano dot and the quantum well in the state of $A_xB_{1-x}/B_{1-z}C_z/B_{1-y}C_y$(y<z).

Through this principle, the A-rich $A_xB_{1-x}$ nano dot is intentionally grown, the atom B spreads into the $A_xB_{1-x}$ nano dot by the heating treatment, and then the $B_{1-z}C_z$ interface layer, in which the concentration of the atom C is high, is formed at the interface. As the complicate material, $A_{1-x}B_x$:C is applicable which the atom C is previously added to the $A_xB_{1-x}$ by the appropriate amount. Originally, $A_xB_{1-x}$ phase becomes stable, and the atom C moves into the exterior of the nano dot, thereby the $B_{1-z}C_z$ thin film, in which the concentration of the atom C is high, is formed at the interface between the nano dot and the $B_{1-y}C_y$ quantum well.

As the example of forming the dual nano dot using the phase segregation, there is a β-FeSi$_2$ nano dot formed in the SiGe quantum well. The dual confined nano dot may be acquired through the $Si_{1-z}Ge_z$ layer having a high Ge content is formed between the nano dot and the quantum well layer. The $Si_{1-z}Ge_z$ layer may be formed by depositing an Fe-rich β-FeSi$_2$ or β-FeSi$_2$:G doped with Ge on the $Si_{1-y}Ge_y$ quantum well layer and performing the heating treatment at the high temperature of 800–1100° C.,. If the β-FeSi$_2$ nano dot is simply formed in the silicon n-p junction, the stagger type band structure is formed in the silicon and the spatial confinement effect of the electron is heightened. However, the low spatial confinement effects of the hole lower the probability of the recombination between the electron and the hole. Accordingly, in case the direct transition type β-FeSi$_2$ nano dot is applied to the silicon, which is the indirect transition type semiconductor, the nano dot may be positioned in the SiGe quantum well layer having a small band gap such as Si/SiGe/Si, thereby the quantum efficiency thereof can be increased.

On the other hand, in addition to the epitaxial growth method, a magnet sputtering method, a pulse laser ablation method, or an ion injecting method may be applicable. In other words, the Fe nano dot or FeSi$_x$ (0<x<3) nano dot having a wide composition distribution is deposited or ion-injected at the desired location by a physical method and is transformed into a silicide by heating treatment, thereby the spherical β-FeSi$_2$ nano dot is formed. The composition of the deposited nano dot and the ion-injected distribution allow the diameter, the composition, and the conducting property to be controlled in the distribution nano dot forming process by the high-temperature heating treatment.

Figure 4A:
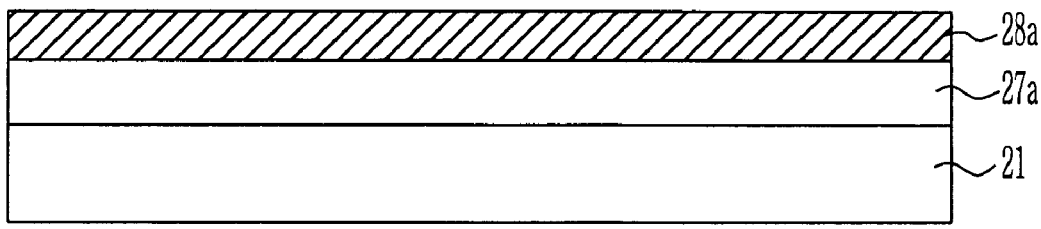
FIGS. 4A to 4C show a process for forming nano dots in a quantum well layer in the optoelectronic device according to the present invention.
Figure 4B:
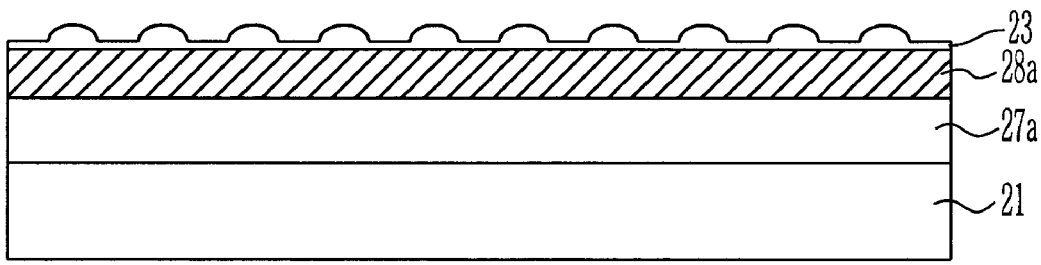
Figure 4C:
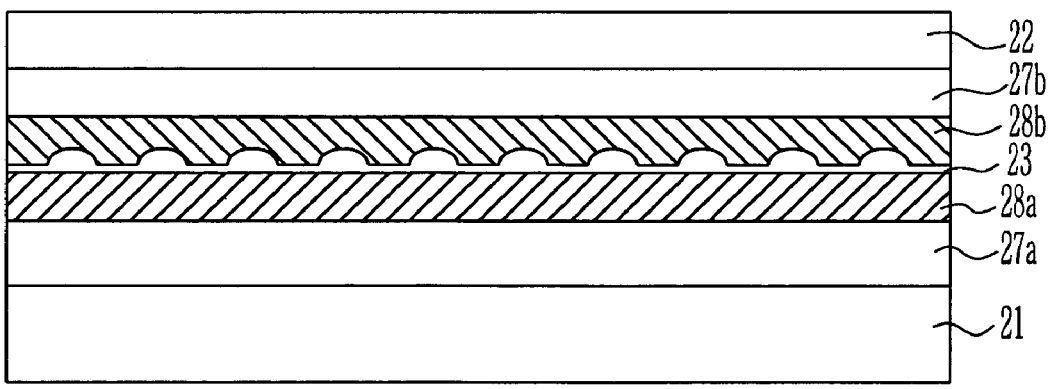

Hereinafter, the example of manufacturing the optoelectronic device for forming the nano dot in the quantum well layer will be explained, with references to FIGS. 4A to 4C. FIGS 4A to 4C show a process for forming a nano dot in a quantum well layer.

Referring to FIG. 4A, a silicon used as the general substrate or a semiconductor substrate such as GaAs is inserted in an epi-growth apparatus and an electron injection layer 21, a shallow quantum well layer 27a, and a deep quantum well layer 28a are grown in sequence. For growth of the epi-layer, a growing apparatus such as RPCVD, MBE, MOCVD, or UHVCVD is applicable. In this case, for the subsequent growth of the nano dot, it is preferable that the apparatus had at least two chambers and the growth surface is controlled so that the nano dot is spontaneously formed at a low temperature.

Referring to FIG. 4b, the nano dot layer 23 is grown by using the direct transition type semiconductor material having a lattice constant greater than that of the quantum well layer 28a. In the initial state of nano growth, several atom layers are grown layer by layer, and the nano dot begins to be formed in the SK (Stranski-Krastanov) mode under the condition of maintaining the compressive stress and the equilibrium state of the surface energy. At this time, the density and the size of the nano dot are determined in accordance with the temperature of the substrate and flow rate of the supplied source gas. In addition, a surfactant such as B, As, P, or S or a metal is absorbed to the surface of the substrate, thereby the density of the nano dot can be highly adjusted. The diameter of the direct transition type nano dot formed as mentioned above is several tens nm, and the surface density thereof is controlled to become not less than $10^{11}$ cm$^{-2}$, thereby the emitting gain can be increased, based on the recombination of the carriers.

Next, referring to FIG. 4C, the deep quantum well layer 28b and the shallow quantum well layer 27b are grown on the above-mentioned nano dot layer 23. In the growth of the deep quantum well layer 28b, in order to increase the confinement effect of the carriers and reduce the loss due to scattered reflection of photons, the temperature of the substrate is increased to 100–200°, and the growth rate is reduced to 0.2–0.5 times, and then the planarization of the quantum well layer is performed. At this time, the growth rate of the epi-crystal is suitably so that the defect is not generated at the interface between the nano dot and quantum well layer.

After the planarization of the quantum well layer is performed, a hole injection layer 22 is formed on the shallow quantum well layer 27b.

The embodiment of manufacturing the optoelectronic device by forming the internal nano dot in the external nano dot of the quantum well layer will be explained with reference to FIGS. 5A to 5D.

Figure 5A:
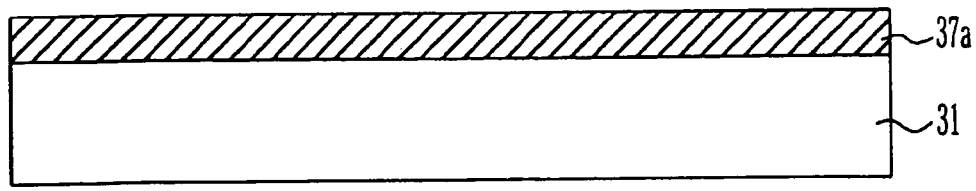
FIGS. 5A to 5D are cross sectional views for illustrating the method for manufacturing the optoelectronic device using dual-structural nano dots according to the present invention.

Referring to FIG. 5A, a lower quantum well layer 37a is grown on an electron injection layer 31. The indirect transition type semiconductor or the direct transition type semiconductor may be applicable to the quantum well layer 37. The thickness of the lower quantum well layer 37a is adjusted to several tens nm to concentrate the carriers, thereby the lower quantum well layer has an allowed quantized energy level.

Figure 5B:
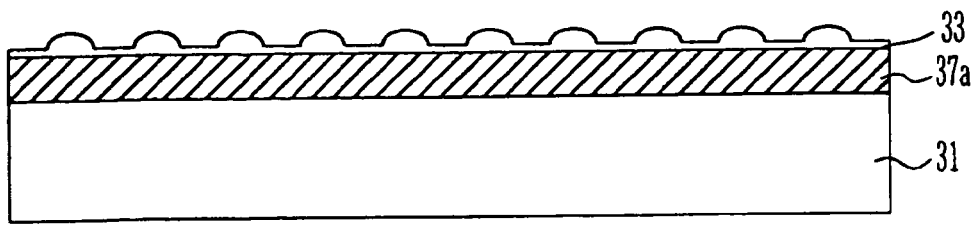

Referring to FIG. 5B, the nano layer 33 is manufactured by the growing method of the SK mode. The self-assembled nano dots are formed by the difference of the lattice constant between the quantum well layer and the nano layer, thereby the density, the size, and the composition of the nano dot are determined.

Figure 5C:
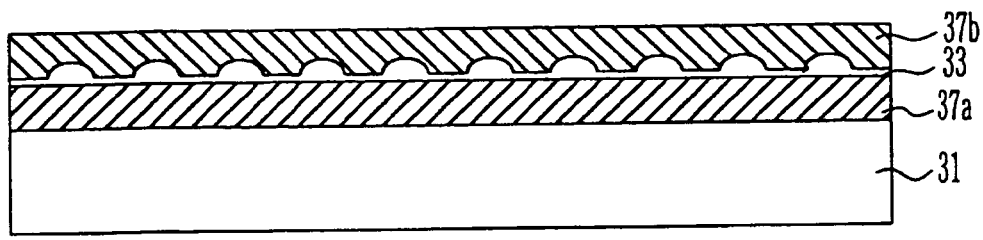

Referring to FIG. 5C, an upper quantum well layer 37b is grown. During the growth of upper quantum well layer, the epi-growth is controlled in atom unit order so that the planar surface is recovered from the rough surface and the defect is not generated at the interface thereof. The epi-growth having the planarization effect is performed at the high temperature of 100–200° C. for increasing the mobility of the atoms in the surface.

Figure 5D:
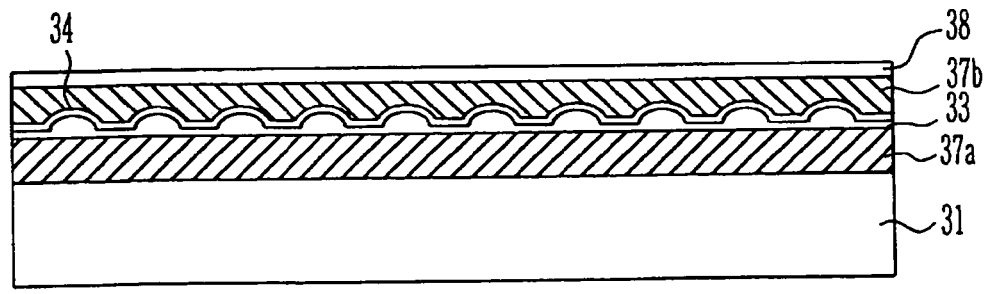

Referring to FIG. 5D, according to the segregation phenomenon at the interface between the nano dot layer and the quantum well layer 37, the external nano dot layer 34 is formed by the high-temperature heating treatment of about 100–200°C. At this time, the size and the distribution of the internal nano dot layer 33 and the external nano dot layer 34 are controlled and the crystal defect at the interface is reduced. Next, the hole injection layer 38 is formed on the planar quantum well layer 37.

Next, the other example of manufacturing the optoelectronic device having dual nano dot with reference to FIGS. 6A to 6D will be explained. The spherical dual nano dot, which includes the internal nano dot and the external nano dot, can be formed by means of various growth methods such as the epi-growth method, the ion injecting method, or the sputtering method. For obtaining the excellent crystal quality, it is preferable for manufacturing the dual nano dot at the therman equilibrium by epi-growth method in control of the atom unit order.

Figure 6A:
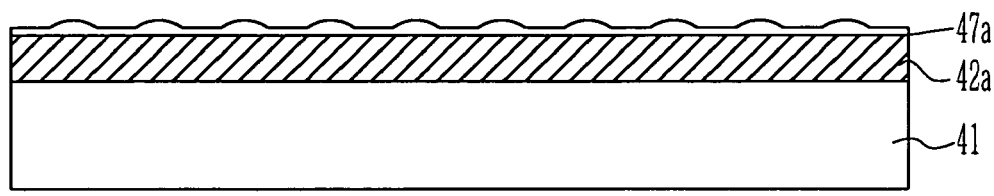
FIGS. 6A to 6D are cross sectional views for illustrating the method for manufacturing the optoelectronic device using dual-structural nano dots according to the present invention.

Referring to FIG. 6A, a portion of a lower shallow hole injection layer 42a is grown on an electron injection layer 41 and a lower epi-layer 47a for the external nano dot is grown thereon. In this case, the preferable thickness of the lower hole injection layer 42a is about several tens nm for the injection of the minority carrier. The preferable thickness of the lower epi-layer 47a is about several nm.

Figure 6B:
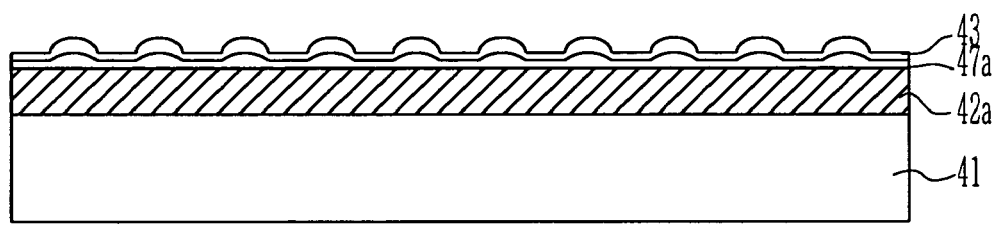

Referring to FIG. 6B, the nano dot layer 43 is formed by the epi-growth method, based on the SK mode.

Figure 6C:
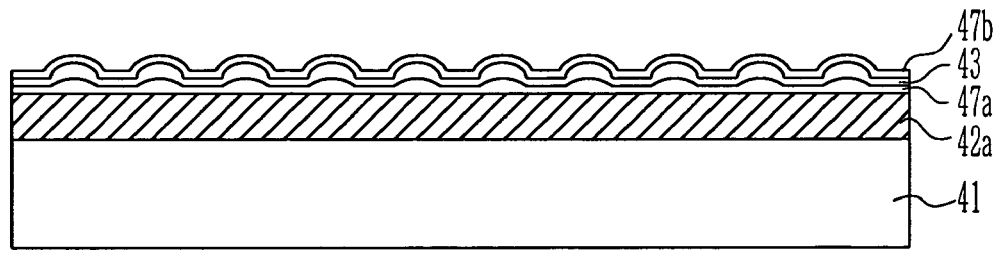

Referring to FIG. 6C, an upper epi-growth layer 47b for forming the external nano dot is grown and is transformed into the dual nano dot by the heating treatment. In this case, the epi-growth layers 47a and 47b to be used to the external nano dot are previously grown in the upper and the lower portions of the internal nano dot with a thickness of several tens nm. This structure is particularly useful when the agglomeration or the segregation phenomenon of the phase between the nano dot and the quantum well layer can't sufficiently form the external nano dot. It goes without saying that the thermodynamic stability has to remain not to be changed into a third phase due to the spread or the reaction between the atom composing the nano dot and the atom composing the quantum well.

Figure 6D:
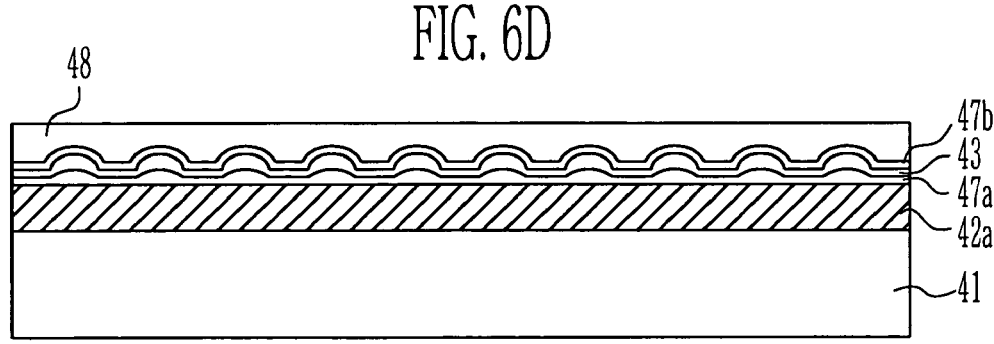

Subsequently, the hole injection layer 48 is formed on the overall structure, as shown in FIG. 6D.

As mentioned above, in addition to the hole injection layer on the electron injection layer, the small nano dot is formed in the large nano dot and the quantum well layer to increase the confinement density of electrons and the holes, thereby the photoelectric effect of the light emission and the light reception is increased. At this time, the nano dot uses the direct transition type semiconductor material, and, accordingly, the optoelectric device having a high efficiency can be manufactured in the direct transition type semiconductor substrate or the indirect transition type semiconductor substrate.

Although the present invention has been illustrated and described with respect to exemplary embodiments thereof, the present invention should not be understood as limited to the specific embodiment, and it should be understood by those skilled in the art that the foregoing and various other changes, omission and additions may be made therein and thereto, with departing from the spirit and scope of the present invention.

What is claimed is:

1. A method of manufacturing an optoelectric device, comprising the steps of:
   forming an electron injection layer on a semiconductor substrate;
   growing nano dot layer on said electron injection layer by an epigrowth method;
   heating said nano dot layer so that said nano dot has a dual structure comprising an external nano dot and an internal nano dot; and
   forming a hole injection layer on the overall structure.

2. The method of manufacturing the optoelectric device according to claim 1, further comprising the step of forming a quantum well layer, before or after the step of growing said nano dot layer.

3. The method of manufacturing the optoelectric device according to claim 1, further comprising the step of forming an epi-layer to be utilized as said external nano dot layer, before or after the step of growing said nano dot layer.

4. The method of manufacturing the optoelectric device according to claim 1, wherein said external nano dot is formed with an indirect transition type semiconductor, and said internal nano dot is formed with a direct transition type semiconductor.

5. The method of manufacturing the optoelectric device according to claim 1, wherein in the step for growing said nano dot layer, at least two nano dot layers are repeatedly formed.

6. The method of manufacturing the optoelectric device according to claim 2, wherein said electron injection layer and said hole injection layer are made of a material of Si, GaAs, GaN, InP, or SiC, and said quantum well layer is made of a material of SiGe, InGaAs, InGaN, or InAsP.

7. The method of manufacturing the optoelectric device according to claim 1, wherein the diameter of said external nano dot is in range of 10 to 100 nm, and the diameter of said internal nano dot is less than or equal to 12 nm.

\* \* \* \* \*